(12) United States Patent
Tan et al.

(10) Patent No.: US 9,837,312 B1
(45) Date of Patent: Dec. 5, 2017

(54) ATOMIC LAYER ETCHING FOR ENHANCED BOTTOM-UP FEATURE FILL

(71) Applicant: Lam Research Corporation, Fremont, CA (US)

(72) Inventors: Samantha Tan, Fremont, CA (US); Taeseung Kim, Fremont, CA (US); Jengyi Yu, San Ramon, CA (US); Praveen Nalla, Fremont, CA (US); Novy Tjokro, Union City, CA (US); Artur Kolics, Dublin, CA (US); Keren Jacobs Kanarik, Los Altos, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/286,421

(22) Filed: Oct. 5, 2016

Related U.S. Application Data (60) Provisional application No. 62/365,689, filed on Jul. 22, 2016, provisional application No. 62/370,650, filed on Aug. 3, 2016.

(51) Int. Cl.
| | |
|---|---|
| *H01L 21/768* | (2006.01) |
| *H01L 21/3213* | (2006.01) |
| *C23C 18/16* | (2006.01) |
| *H01L 21/3065* | (2006.01) |
| *H01J 37/32* | (2006.01) |

(52) U.S. Cl.
CPC .... *H01L 21/76879* (2013.01); *C23C 18/1628* (2013.01); *C23C 18/1632* (2013.01); *H01J 37/3244* (2013.01); *H01J 37/32082* (2013.01); *H01J 37/32889* (2013.01); *H01J 37/32899* (2013.01); *H01J 37/32926* (2013.01); *H01L 21/3065* (2013.01); *H01L 21/32136* (2013.01); *H01J 2237/334* (2013.01)

(58) Field of Classification Search
CPC ......... H01L 21/31116; H01L 21/31138; H01L 21/32136; H01L 21/76883; H01J 37/3244; H01J 37/32082; H01J 2237/334; C23F 4/00

See application file for complete search history.

(56) References Cited

U.S. PATENT DOCUMENTS

| | | | |
|---|---|---|---|
| 4,592,801 A | 6/1986 | Hara et al. | |
| 6,022,806 A * | 2/2000 | Sato | C23C 16/045 257/E21.015 |
| 6,177,353 B1 | 1/2001 | Gutsche et al. | |
| 6,482,745 B1 | 11/2002 | Hwang | |
| 7,196,955 B2 | 3/2007 | Nickel | |
| (Continued) | | | |

FOREIGN PATENT DOCUMENTS

| | | |
|---|---|---|
| WO | WO 2016/100873 | 6/2016 |

OTHER PUBLICATIONS

U.S. Office Action dated May 5, 2016 issued in U.S. Appl. No. 14/749,285.

(Continued)

*Primary Examiner* — Caridad Everhart
(74) *Attorney, Agent, or Firm* — Weaver Austin Villeneuve & Sampson, LLP (57) ABSTRACT

Atomic layer etching (ALE) enables effective filling of small feature structures on semiconductor and other substrates, such as contacts and vias, by bottom-up fill, for example electroless deposition (ELD) of cobalt.

20 Claims, 6 Drawing Sheets

(56) References Cited

U.S. PATENT DOCUMENTS

| | | |
|---|---|---|
| 7,795,148 B2 | 9/2010 | Brown |
| 8,252,194 B2 | 8/2012 | Kiehlbauch et al. |
| 8,622,020 B2 | 1/2014 | Thie et al. |
| 8,993,352 B2 | 3/2015 | Nishimura et al. |
| 9,130,158 B1 | 9/2015 | Shen et al. |
| 9,257,638 B2 | 2/2016 | Tan et al. |
| 9,449,843 B1 | 9/2016 | Korolik et al. |
| 9,576,811 B2 | 2/2017 | Kanarik et al. |
| 2001/0053585 A1 | 12/2001 | Kikuchi et al. |
| 2002/0009883 A1* | 1/2002 | Ogure .................. C23C 14/046 438/676 |
| 2002/0058409 A1* | 5/2002 | Lin ..................... H01L 21/2885 438/638 |
| 2004/0004056 A1 | 1/2004 | Sasaki et al. |
| 2004/0137749 A1 | 7/2004 | Ying et al. |
| 2004/0209476 A1 | 10/2004 | Ying et al. |
| 2005/0006222 A1 | 1/2005 | Ding et al. |
| 2005/0098440 A1* | 5/2005 | Kailasam ................ C25D 7/12 205/183 |
| 2006/0009040 A1 | 1/2006 | Tomioka et al. |
| 2006/0194435 A1 | 8/2006 | Nishimura et al. |
| 2007/0049036 A1 | 3/2007 | Huang |
| 2007/0202254 A1* | 8/2007 | Ganguli .................. C23C 16/18 427/252 |
| 2007/0238301 A1 | 10/2007 | Cabral et al. |
| 2007/0246442 A1 | 10/2007 | America et al. |
| 2009/0020884 A1 | 1/2009 | Lee et al. |
| 2009/0226611 A1* | 9/2009 | Suzuki .............. H01L 21/76843 427/250 |
| 2009/0256220 A1 | 10/2009 | Horng et al. |
| 2011/0212274 A1 | 9/2011 | Selsley |
| 2012/0009785 A1 | 1/2012 | Chandrashekar et al. |
| 2012/0276657 A1 | 11/2012 | Joubert et al. |
| 2013/0105303 A1 | 5/2013 | Lubomirsky et al. |
| 2013/0168354 A1 | 7/2013 | Kanarik |
| 2015/0214474 A1 | 7/2015 | Nishimura et al. |
| 2015/0270140 A1* | 9/2015 | Gupta ............... H01L 21/32136 216/67 |
| 2016/0020152 A1 | 1/2016 | Posseme |
| 2016/0203995 A1 | 7/2016 | Kanarik et al. |
| 2016/0308112 A1* | 10/2016 | Tan ......................... H01L 41/47 |
| 2016/0314985 A1* | 10/2016 | Yang .................. H01J 37/32449 |
| 2017/0040214 A1* | 2/2017 | Lai .................... H01L 21/76883 |
| 2017/0053810 A1* | 2/2017 | Yang ......................... C23F 4/00 |

OTHER PUBLICATIONS

U.S. Final Office Action dated Sep. 23, 2016 issued in U.S. Appl. No. 14/749,285.

U.S. Office Action dated Feb. 17, 2017 issued in U.S. Appl. No. 14/749,285.

U.S. Final Office Action dated Mar. 30, 2017 issued in U.S. Appl. No. 14/749,285.

U.S. Office Action dated Nov. 28, 2016 issued in U.S. Appl. No. 14/749,291.

U.S. Office Action dated Jul. 1, 2016 issued in U.S. Appl. No. 14/830,683.

U.S. Final Office Action dated Feb. 7, 2017 issued in U.S. Appl. No. 14/830,683.

Carver et al. (Feb. 20, 2015) "Atomic Layer Etching: An Industry Perspective," *ECS Journal of Solid State Science and Technology*, 4(6):N5005-N5009.

Kanarik et al. (Mar./Apr. 2015) "Overview of atomic layer etching in the semiconductor industry," *J. Vac. Sci. Technol. A* 33(2):020802-1-020802-14.

Kanarik et al. (2017) "Predicting synergy in atomic layer etching," *J. Vac. Sci. Technol. A*,35(5):05C302-1 through 05C302-7.

Lee et al. (2015) "Atomic Layer Etching of $Al_2O_3$ Using Sequential, Self-Limiting Thermal Reactions with $Sn(acac)_2$ and Hydrogen Fluoride," $^{ACS}NANO$, 9(2):2061-2070.

Safranek, Berkenkotter and Stephens, (1990) "Electroless Cobalt and Cobalt Alloys," *Electroless Plating*, William Andrew Publishing, Chapter 18, Section 1:pp. 463-480 and Section 2:pp. 481-509.

Wolf, S. and Tauber, R.N. (1986) "Silicon Processing for the VLSI Era," *vol. 1—Process Technology, Lattice Press*, pp. 542-557.

U.S. Office Action dated Aug. 25, 2017 issued in U.S. Appl. No. 15/239,138.

U.S. Office Action dated Jul. 25, 2017 issued in U.S. Appl. No. 14/830,683.

U.S. Notice of Allowance dated Jun. 30, 2017 issued in U.S. Appl. No. 14/749,291.

U.S. Office Action dated Aug. 11, 2017 issued in U.S. Appl. No. 14/749,285.

* cited by examiner

ATOMIC LAYER ETCHING FOR ENHANCED BOTTOM-UP FEATURE FILL

CROSS-REFERENCE TO RELATED APPLICATION

This application claims benefit of U.S. Provisional Patent Application No. 62/365,689, filed Jul. 22, 2016, and titled "USING ATOMIC LAYER ETCHING (ALE) TO ENABLE FILLING OF SMALL HOLES USING ELECTROLESS DEPOSITION (ELD);" and 62/370,650, filed Aug. 3, 2016, and titled "USING ATOMIC LAYER ETCHING (ALE) TO ENABLE FILLING OF SMALL HOLES USING ELECTROLESS DEPOSITION (ELD); which are incorporated by reference herein in their entirety and for all purposes.

BACKGROUND

Semiconductor fabrication processes often involve deposition of metals into features, such as vias or trenches, to form contacts or interconnects. However, as devices shrink, features become smaller and harder to fill, particularly in advanced logic and memory applications. New fill materials and techniques have been proposed. Current technology for preparing a feature on a semiconductor substrate to be filled with some of these materials/techniques is a wet clean. A problem with wet clean is that it is not generally selective for etching in the field around the feature opening or neck area of the feature opening alone, as would be desirable. A general wet etching/clean chemistry also removes deposited metal or catalytic deposition seed film from the bottom of the feature structure resulting in failure of bottom-up fill. And partial or incomplete removal of metal or a catalytic layer from the field and neck can result in early pinch-off and void formation.

SUMMARY

This disclosure describes atomic layer etching (ALE) to enable effective filling of small feature structures on semiconductor and other substrates, such as contact to source/drain, contact to gate, and vias. In a particular embodiment, bottom-up fill by electroless deposition (ELD) is used, in particular cobalt (Co) ELD. The disclosure is also applicable to other ELD fill materials, such as Co alloys, Cu, Cu alloys, Ni, Ni alloys and Ruthenium.

In particular, directional ALE is used, whereby at least one of the ALE operations is directional, such as by using inert energetic ions in the removal operations. The ALE is applied before the ELD operation in order to open up the top of the feature, and is particularly, although not solely, applicable when there is severe overhang or pinch-off at the feature opening due to previous deposition operations (such as of barrier layers like TiN deposition and seed layers like Co, Cu or Ru PVD), and preferably to also remove any residual metal or catalytic layer on the field to avoid initiating ELD on the field.

In various embodiments, the ALE involves: (a) exposing a substrate situated in a chamber to a halogen-containing gas to modify the surface of the substrate, (b) exposing the substrate to an activation gas and an activation source (e.g., a plasma) to etch one or more layers on the substrate. A reactive material that is reactive with both the halogen-containing gas and a material of the one or more layers on the substrate forms a volatile species to remove the desired material. In various embodiments, the modification operation can be conducted with silicon and halogen species, including SiHaXb, wherein X is a halogen including Cl, F, Br, and I, and a+b=4, and can also include a separate species including one or more of a halogen, hydrogen, or halogenated or hydrogenated species, such as $H_2$, HCl, $Cl_2$, HF, HBr, HBF, $BF_2$, $BCl_3$, $BBr_3$, $BI_3$, $F_2$, $BF_3$, $Br_2$ and/or $I_2$. The modification operation is conducted so that modification of the surface material to be etched is favored over substantial deposition. This Directional ALE can be conducted so that the bottom of the feature to be filled is sub-saturated with the species used to modify the surface, for example, by limiting the time of that process operation. The feature sidewalls, being substantially vertical, are not substantially impacted by energetic ions during the activation operation. In this way, the top/opening of the feature and the field surrounding the feature are selectively/preferentially etched relative to the sidewalls and bottom of the feature so that by alternating the ALE and ELD operations, bottom-up fill is achieved.

Another aspect involves an apparatus for processing semiconductor substrates, the apparatus including: a process chamber including a showerhead and a substrate support, a plasma generator, and a controller having at least one processor and a memory, whereby the at least one processor and the memory are communicatively connected with one another, the at least one processor is at least operatively connected with flow-control hardware, and the memory stores machine-readable instructions for: (a) directionally etching a deposited material from at least one of a neck region and an adjacent field region of a feature on a semiconductor substrate by, (i) modifying the surface of the deposited material by exposing the material to a halogen-containing gas, and (ii) exposing the modified surface to an activation gas to selectively etch the modified deposited material; and (b) depositing a metal in the feature by a bottom-up fill deposition technique.

The substrate support may include a bias, and the memory may further store machine-readable instructions for setting the bias power during (a). In some embodiments, the memory further stores machine-readable instructions for igniting a plasma during (ii).

In some embodiments, the memory further stores machine-readable instructions for repeating (ii) and (iii) in cycles. In some embodiments, the memory further stores machine-readable instructions for after performing (ii) and (iii), repeating (i).

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Introduction

Semiconductor fabrication processes often involve deposition of metals into features, such as vias or trenches, to form contacts or interconnects. Interconnects have typically been formed with copper, using dual damascene processing techniques and copper interconnects are capped by liners, such as a tantalum and/or tantalum nitride liner. A concern with copper interconnect structures is that they are highly susceptible to electromigration, which can lead to void formation and device failure. Some processes involve high-k metal gate filling with tungsten, and tungsten may also be used to form a metal contact to a source/drain contact. However, tungsten has a high sheet resistance compared to some other metals such as cobalt, particularly in small features. Small features may have a technology node less than about 10 nm. This and other issues have led to interest in the use of other metals as interconnects. Cobalt filling may reduce the formation of voids in features, and amongst other things, reduce electromigration concerns.

Cobalt feature fill is often conducted using a bottom-up fill by electroless deposition (ELD). However, as devices shrink, features become smaller and harder to fill by bottom-up fill. For example, features may have a high aspect ratio, such as at least about 3:1 or greater, with a small opening of less than about 20 nm, or even 10 nm or less. Some features may also include a re-entrant feature profile, which is further described below with respect to FIG. 2. For features in advanced technology nodes, the deposition rate at or near the opening of the feature, also referred to as the neck, may be faster than deposition at the bottom of the feature, which causes the opening to close before the entire feature is filled, leaving behind a void or gap in the feature. The presence of such gaps may be detrimental to the performance and reliability of the semiconductor device, and ultimately the semiconductor product.

Additionally, some substrates may include features of various sizes. As a result, features are filled or the openings of the features are closed more quickly in smaller features than in larger features, and larger features may not be completely filled. The small opening and high aspect ratio of features may also cause non-conformal deposition of tungsten within a feature. Additionally, in re-entrant feature profiles caused by conventional deposition techniques and possible overhang of an underlying barrier or glue layer due to non-conformal coverage on the feature, the feature may have a net re-entrant sidewall profile, which makes complete fill of the feature challenging.

This disclosure describes atomic layer etching (ALE) to enable effective filling of small feature structures on semiconductor and other substrates, such as contact to source/drain, contact to gate, and vias. In a particular embodiment, bottom-up fill by electroless deposition (ELD) is used, in particular cobalt (Co) ELD. The disclosure is also applicable to other bottom-up/ELD fill materials, such as Co alloys, Cu, Cu alloys, Ni, Ni alloys and Ruthenium.

In particular, directional ALE is used, whereby at least one of the operations is directional, such as by using inert energetic ions in the removal operations. The ALE is applied before the ELD operation in order to open up the top of the feature, which may have severe overhang or pinch due to previous deposition operations (such as of barrier layers like TiN deposition and seed layers like Co PVD, Cu, Ru), and preferably to also remove any residual Co or catalytic layer (such as, for example, Cu, Ni, Ag, Ru, Pd, Pt or their alloys, on the field to avoid initiating Co ELD on the field. Co ALE, using both $Cl_2$—Ar chemistry and Si-based chemistry, has previously been described in application Ser. Nos. 14/749,285 and 14/747,291, for example, the disclosures of which relating to ALE, applicable in this context, are incorporated by reference herein. As described therein, in various embodiments, the ALE involves: (a) exposing a substrate situated in a chamber to a halogen-containing gas to modify the surface of the substrate, (b) exposing the substrate to an activation gas and an activation source to etch one or more layers on the substrate. A reactive material that is reactive with both the halogen-containing gas and a material of the one or more layers on the substrate forms a volatile species to remove the desired material. In various embodiments, the modification operation can be conducted with silicon and halogen species, including $SiH_aX_b$, wherein X is a halogen including Cl, F, Br, and I, and $a+b=4$, and can also include a separate species including one or more of a halogen, hydrogen, or halogenated or hydrogenated species, such as $H_2$, HCl, $Cl_2$, HF, HBr, $HBF_2$, $BCl_3$, $BBr_3$, $BI_3$, $F_2$, $BF_3$, $Br_2$ and/or $I_2$. The modification operation is conducted so that modification of the surface material to be etched is favored over substantial deposition. This Directional ALE can be conducted so that the bottom of the feature to be filled is sub-saturated with the species used to modify the surface, for example, by limiting the time of that process operation. The feature sidewalls, being substantially vertical, are not substantially impacted by energetic ions during the activation operation. In this way, the top of the feature and the field surrounding the feature are selectively/preferentially etched relative to the sidewalls and bottom of the feature so that, by alternating the ALE and ELD operations, bottom-up fill is achieved.

In this disclosure, in the principally described embodiment, one or a combination of these ALE processes is applied to remove Co (and some TiN) that is bottlenecking the neck/opening of the feature, while leaving the Co at the bottom of the structure intact and ready to seed the proceeding ELD Co operation. ELD can be conducted as further described, for example, in the following U.S. Patents, each of which is herein incorporated by reference for its disclosure relating to ELD, applicable in this context: U.S. Pat. No. 3,798,056, U.S. Pat. No. 6,713,122, U.S. Pat. No. 7,690,324, and U.S. Pat. No. 8,622,020.

In addition to opening the feature bottleneck, the ALE chemistry may be acting as an inhibitor to further enable the bottom-up-fill. Either way, in various embodiments, another preparation operation may be added after the ALE before ELD using Nitrogen, Phosphorous or Sulfur adsorption, for example, in such a way as to inhibit the Co, or other metal, ELD at the feature neck and the in the adjacent field region, but not the bottom of the feature.

In various embodiments, directional ALE is used because it is selective for the field and neck regions without altering Co or catalytic layer at the bottom of structure. Selective removal of Co from field and neck allows ELD fill from bottom to top without void formation (bottom-up fill).

While the description is this disclosure is primarily with respect to the use of ELD for Co bottom-up feature fill, it is also contemplated that ALE may be combined with other bottom-up feature fill techniques. Accordingly, in alternative embodiments, ALE to selectively remove material from the neck and field regions of the feature without altering the metal or catalytic layer at the bottom of feature structure, as described herein, may be combined any suitable technique for bottom-up filling of a feature with metal.

The disclosed techniques can be implemented, for example, in a cluster tool/platform that incorporates any variety of processing modules for accomplishing the ALE, ELD and other processing techniques. For example, ALE may be conducted in a Kiyo or Flex module, and ELD may be conducted in electroless plating apparatus including 2300® ELD, available from Lam Research Corporation, Fremont, Calif.

The apparatus used for performing the disclosed embodiments often includes a system controller having programming to control the deposition and metrology processes. The controller may execute system control software, which may be stored in a mass storage device, loaded into a memory device, and executed on a processor. The software may be transferred over a network in some cases. Various process tool component subroutines or control objects may be written to control operation of the process tool components necessary to carry out various process tool processes. The system control software may be coded in any suitable computer readable programming language. In some embodiments, the system control software may include input/output control (IOC) sequencing instructions for controlling the various parameters discussed herein. The system controller may also be associated with other computer software and/or programs, which may be stored on a mass storage device or memory device associated with the controller. Examples of programs or sections of programs for this purpose include a wafer positioning and alignment program, a plasma gas control program, a reactant gas control program, a pressure control program, a temperature control program, a plasma control program, and a metrology control program.

Atomic Layer Etch

Figure 1:
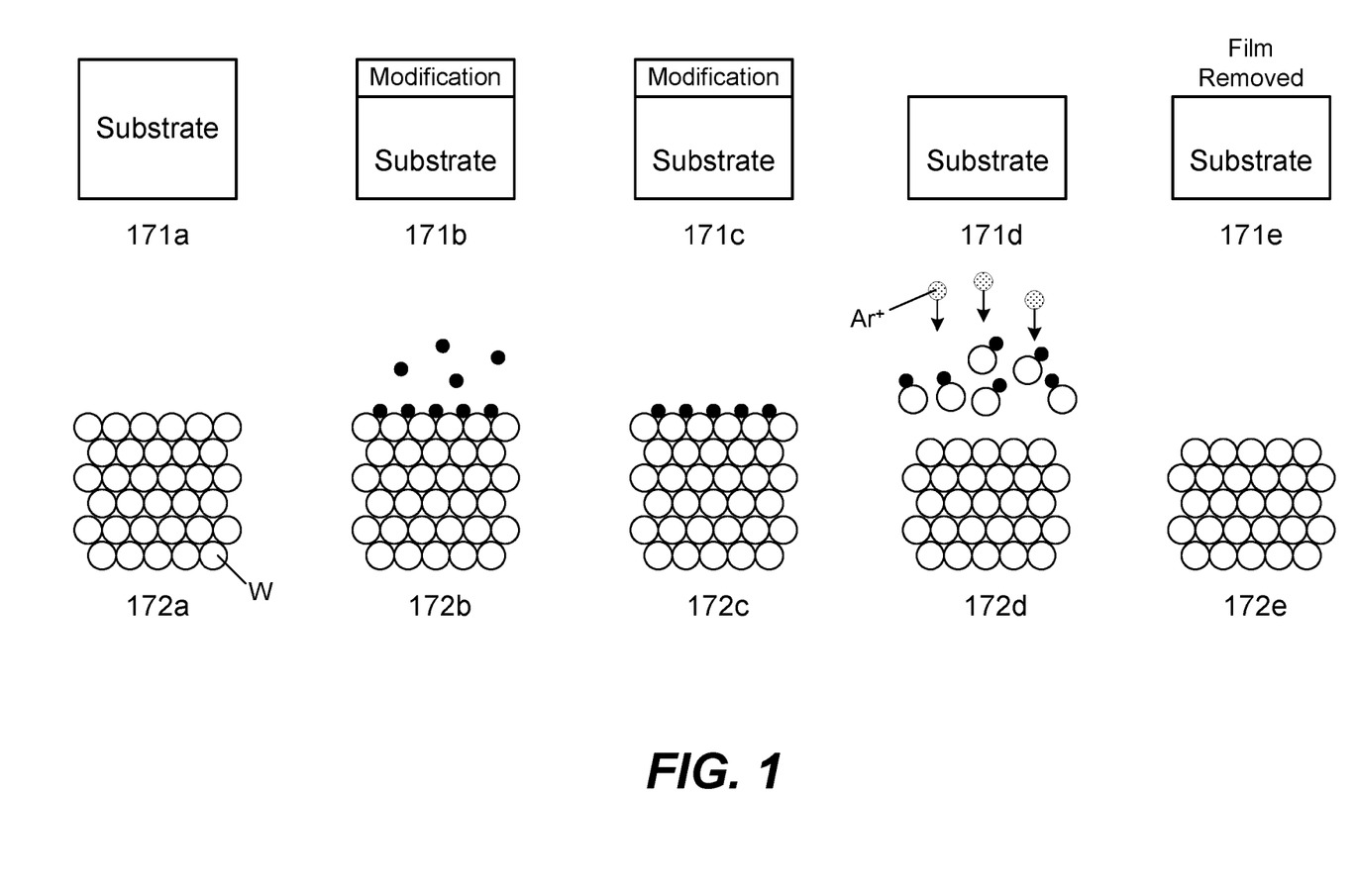
FIG. 1 is a schematic illustration of an example of atomic layer etching of film on a substrate.

FIG. 1 shows two example schematic illustrations of an ALE cycle. Diagrams 171*a*-171*e* show a generic ALE cycle. In 171*a*, a substrate is provided. In 171*b*, the surface of the substrate is modified. In 171*c*, the chemical used to modify the substrate is purged. In 171*d*, the modified layer is being etched. In 171*e*, the modified layer is removed.

Similarly, diagrams 172*a*-172*e* show an atomic scale example of an ALE cycle for etching a cobalt film. In 172*a*, a cobalt substrate surface is provided, which includes many cobalt atoms. In 172*b*, halogen-containing reactant gas is introduced to the substrate, which modifies the surface of the substrate. In various embodiments, the modification operation can be conducted with silicon and halogen species, including $SiH_aX_b$, wherein X is a halogen including Cl, F, Br, and I, and $a+b=4$. A separate species including one or more of a halogen, hydrogen, or halogenated or hydrogenated species, such as $H_2$, HCl, $Cl_2$, HF, HBr, $HBF_2$, $BCl_3$, $BBr_3$, $BI_3$, $F_2$, $BF_3$, $Br_2$ and/or $I_2$ may also be included as a reactant gas in the modification operation. The modification operation is conducted so that modification of the surface material to be etched is favored over substantial deposition.

This Directional ALE can be conducted so that the bottom of the feature to be filled is sub-saturated with the species used to modify the surface, for example, by limiting the time of that process operation. The feature sidewalls, being substantially vertical, are not substantially impacted by energetic ions during the activation operation. In this way, the top of the feature and the field surrounding the feature are selectively/preferentially etched relative to the sidewalls and bottom of the feature so that, by alternating the ALE and ELD operations, bottom-up fill is achieved.

In 172*c*, the reactant gas halogen-containing reactant is purged from the chamber. In 172*d*, a removal gas, such as inert gases argon, neon or krypton, is introduced with a directional plasma, as indicated by the $Ar^+$ plasma species and arrows, to remove the modified surface of the substrate. The activated etching involves the use of inert ions (e.g., $Ar^+$) operating with energy below the sputtering threshold to energize the adsorbed species (e.g., Cl species) to etch away the substrate one monolayer at a time. During this operation, a bias is applied to the substrate to attract ions toward it. In 172*e*, the chamber is purged and the byproducts are removed.

The etch rate for ALE processes is lower than that of a fluorine-based remote plasma etch, but ALE etches more uniformly due to the self-limiting nature of the surface reactions. Thus, ALE processes provide more control over the etching operations, particularly in larger features, such that the amount of material removed in each cycle is limited and not etched too quickly so as to prevent completely etching material from the surface of the feature.

ALE-Assisted Bottom-Up Fill

Figure 2:
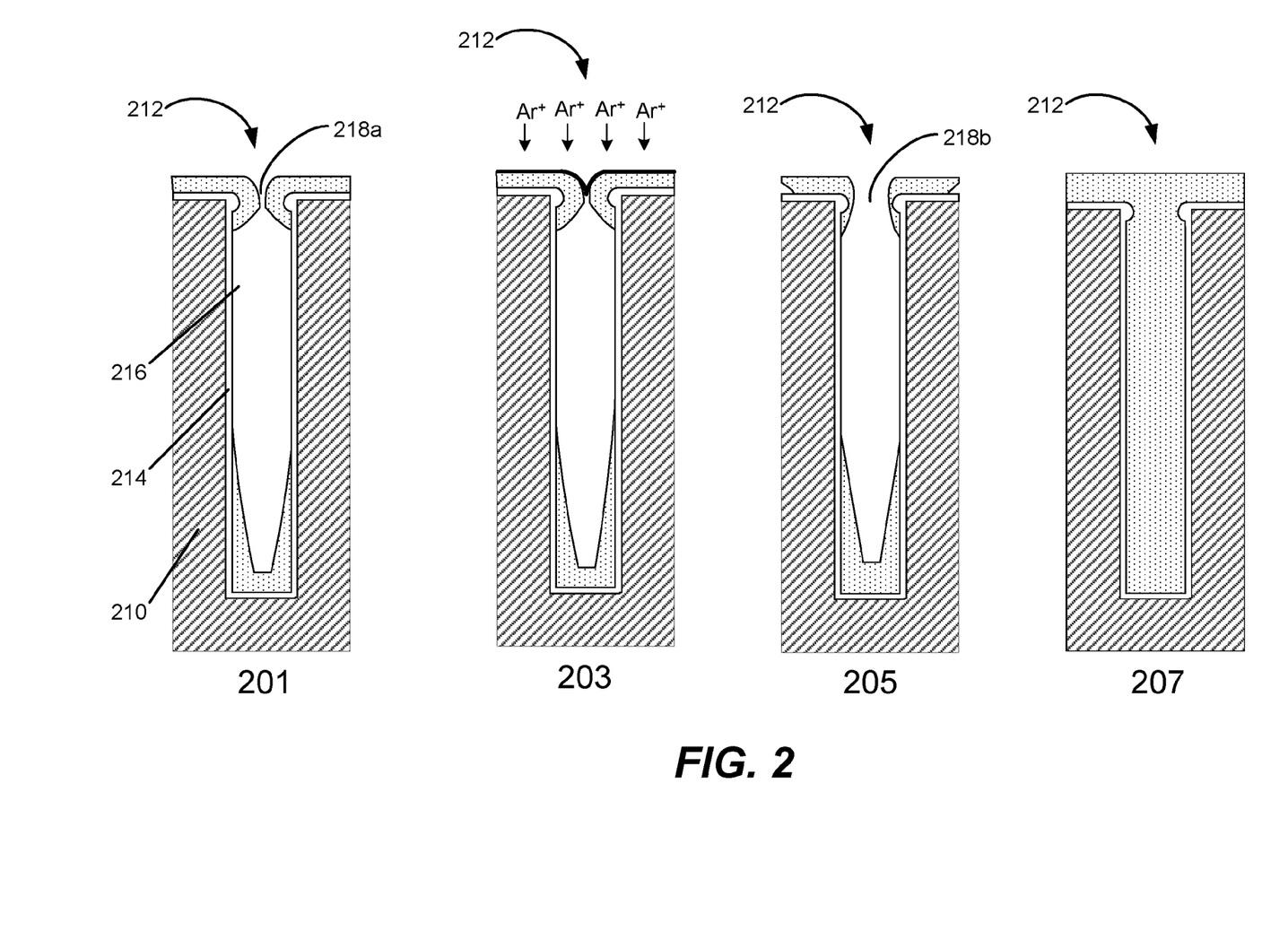
FIG. 2 is a schematic illustration of a feature undergoing operations of certain disclosed embodiments.

Disclosed embodiments involve deposition of a metal, such as cobalt, in a feature by any suitable bottom-up method, such as ELD, following, and optionally preceding, ALE as described above, e.g., by adsorption of a halogen-containing gas and optional exposure to a separate species, and/or a plasma to modify a surface of the deposited metal and exposure to an activation gas to remove the modified surface. FIG. 2 provides an example schematic illustration of a feature undergoing various operations in accordance with disclosed embodiments. In 201, a substrate 210 is shown with a feature 212, which includes a TiN barrier layer 214 deposited conformally in the feature and cobalt 216 deposited over the TiN barrier layer 214. In 203, after the feature 212 is exposed to a halogen-containing gas to modify the surface of the deposited cobalt 216, the feature 212 is exposed to an activation gas, e.g., argon, to etch the cobalt 216 at or near the opening (neck) 218*a* of the feature 212 directionally, such as by using a low bias. As noted above, the field region adjacent to the opening/neck may also be etched in this operation to remove seed metal or catalyst and thereby prevent or disfavor subsequent deposition of metal in this region. The modification of removal operations may be repeated (cycled) as many times as necessary to remove the desired amount of material. In 205, the opening 218*b* of the feature 212 has been widened by removal of fill material at the neck. In 207, the feature 212 is subsequently filled with cobalt by ELD. The ALE and ELD operations may be repeated (cycled) as many times as necessary to yield a void-free cobalt filled feature.

Figure 3:
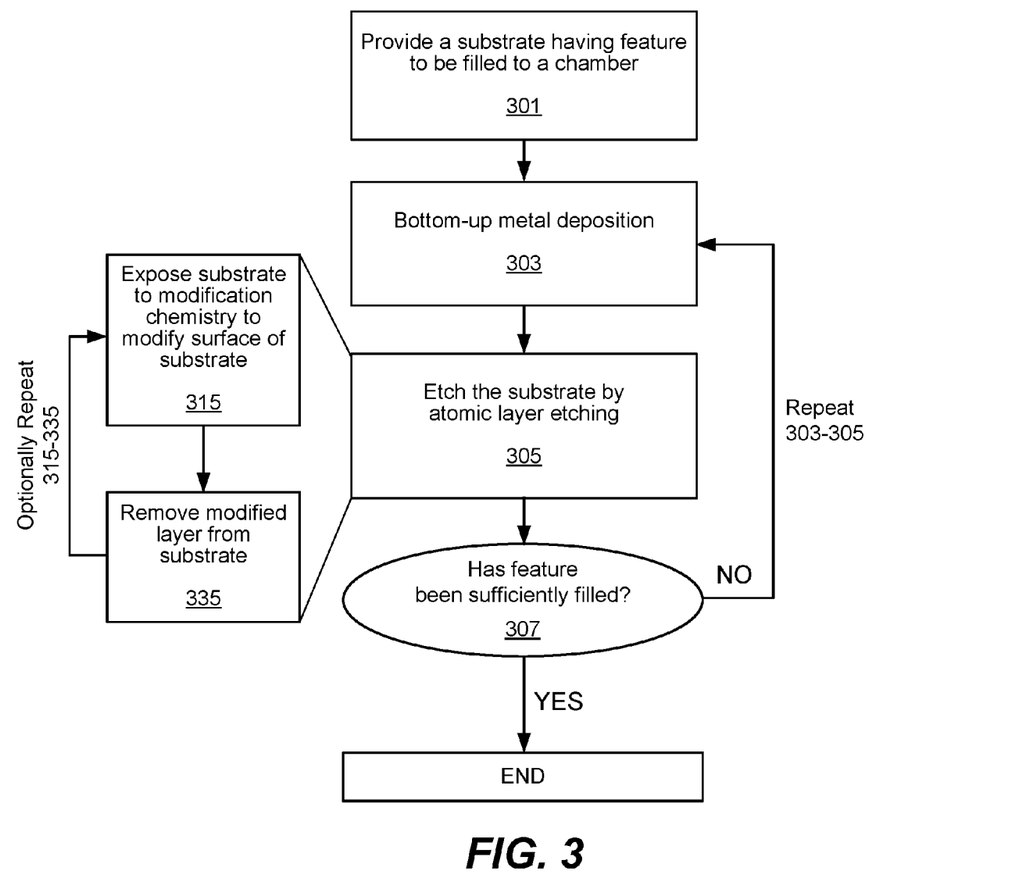
FIG. 3 is a process flow diagram depicting operations performed in accordance with certain disclosed embodiments.

FIG. 3 provides a process flow diagram depicting operations in a method in accordance with disclosed embodiments. While the description below focuses on cobalt feature fill, aspects of the disclosure may also be implemented with other bottom-up/ELD fill materials, such as Co alloys, Cu, Cu alloys, Ni, Ni alloys and Ruthenium, for example. The depicted and described process flow illustrates an embodiment in which bottom-up (ELD) feature fill is conducted prior to and following ALE to complete the feature fill. It should be understood that the described techniques are also applicable in contexts in which the feature fill technique that initially precedes the ALE is not a bottom-up fill technique; in this context FIG. 3 can be understood as depicting latter operations in a feature fill process.

In operation 301 of FIG. 3, a substrate is provided to a chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. A patterned substrate may have "features" such as vias or contact holes, which may be characterized by one or more of narrow and/or re-entrant openings, constrictions within the features, and high aspect ratios. The features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

Examples of applications include logic and memory contact fill, DRAM buried wordline fill, vertically integrated memory gate/wordline fill, and 3-D integration with through-silicon vias (TSVs). The methods described herein can be used to fill vertical features, such as in vias, and horizontal features, such as vertical NAND (VNAND) wordlines.

In various embodiments, types of substrates fabricated from performing disclosed embodiments may depend on the aspect ratios of features on the substrate prior to performing disclosed embodiments. In some embodiments, features on a substrate provided in operation 301 may have an aspect ratio of at least about 2:1, at least about 3:1, at least about 4:1, at least about 6:1, at least about 10:1, or higher. The feature may also have a dimension near the opening, e.g., an opening diameter or line width of between about 5 nm to 500 nm, for example between about 25 nm and about 300 nm. Disclosed methods may be performed on substrates with features having an opening less than about 20 nm. A "small" feature may be defined as a feature having an opening diameter or line width less than that of a "large" feature in relative terms. Large features may have an opening diameter or a critical dimension at least 1.5 times, or at least 2 times, or at least 5 times, or at least 10 times or more than 10 times larger than the critical dimension of small features. Examples of "small" features include features having an opening diameter between about 1 nm and about 2 nm. Examples of "large" features include features having an opening diameter on the order of hundreds of nanometers to about 1 micron.

A via, trench or other recessed feature may be referred to as an unfilled feature, a partially-filled feature, or simply a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the middle and/or bottom of the feature.

In operation 303, metal, e.g., cobalt, is deposited over the substrate and into the feature in a bottom-up fill such as by a suitable electroless deposition (ELD) process to at least partially fill a feature on the substrate. Other suitable metals include a cobalt alloy, copper, a copper alloy, nickel, a nickel alloy or ruthenium. In some embodiments, the deposited material may be or include a catalyst for deposition of the metal.

ELD can be conducted as further described, for example, in the following U.S. Patents, each of which is herein incorporated by reference for its disclosure relating to ELD, applicable in this context: U.S. Pat. No. 3,798,056, U.S. Pat. No. 6,713,122, U.S. Pat. No. 7,690,324, U.S. Pat. No. 8,622,020 and U.S. Pat. No. 9,048,088. In various embodiments, general ELD process flow steps are pre-treatment, deposition, post-treatment and drying. Optional pre-treatment increases the catalytic activity of the substrate and/or creates an oxide-free interface between the substrate and the plated metal. This can be achieved by either removal of oxide or remaining byproduct from previous processing operations (e.g., ALE) from the substrate surface by reducing the oxide layer to metallic state or creating a catalytic enhancement layer to reduce incubation time for plating initiation. The pre-treatment can be a wet or a dry process. Optional post-treatment processes can generally be used to prevent or minimize corrosion of the deposited metal and/or to remove defectivity generated in previous process steps. Pre-treatment and post-treatment operations vary depending on substrate and some cases may not even be necessary. These operations, if used, typically last about 15 to 120 seconds and can be carried out in the electroless plating tool in sequence with the deposition processes. Deposition time will vary depending on target thickness and dimensions of the structures to be filled. Deposition time is generally between about 30 to 300 seconds. Examples of electroless deposition solution can be found in the literature. Some examples are: F. Pearlstein and R. F. Weightman, J. Electrochem. Soc. 121 (1974) 1023; Stojan S. Djokic, J. Electrochem. Soc. 144 (1997) 2358; G. S. Chen, Y. S. Tang, S. T. Chen and T. J. Yang, Electrochem. Solid-State Lett. 9 (2006) C141; the disclosures of which providing electroless deposition solutions and related processes are incorporated by reference herein.

In features that include constrictions or are otherwise susceptible to pinch-off, operation 303 can be performed at least until the feature is pinched off, i.e., more rapid deposition in the neck region of the feature and/or the adjacent field region around the feature result in obstruction (bottlenecking) at the opening of the feature such that feature fill can no longer effectively proceed.

In operation 305, the substrate is directionally or preferentially etched by atomic layer etching. "Directional" or "preferential" as used herein may be defined as etching more material at or near the top of the feature, i.e., from at least one of a neck region and an adjacent field region, than in the rest of the feature, such as the interior of the feature, particularly the bottom. Atomic layer etching involves a surface modification and an activation operation. In some embodiments, a carrier gas, which may include $N_2$, Ar, Ne, He, and combinations thereof, is continuously flowed during operation 305. In some embodiments, a carrier gas is only used during a removal process during operation 305. The carrier gas may be used as a purge gas in some operations as described below. In some embodiments, another reactant gas, such as oxygen, is used during operation 305 to remove a modified layer. In some embodiments, a carrier gas is not flowed during removal.

In various embodiments, the ALE involves: (a) exposing a substrate situated in a chamber to a halogen-containing gas to modify the surface of the substrate, (b) exposing the substrate to an activation gas and an activation source (e.g., a plasma) to etch one or more layers on the substrate. In some embodiments, the modification gas chemistry may include an additional material that is reactive with both the halogen-containing gas and a material of the one or more layers on the substrate can form a volatile species to remove the desired material. In operation 315, the substrate is exposed to a modification chemistry to modify a surface of the substrate. In various embodiments, the modification operation can be conducted with silicon and halogen species, including $SiH_aX_b$, wherein X is a halogen including Cl, F, Br, and I, and a+b=4. In some embodiments, the halogen-containing gas may be $SiCl_4$.

In some embodiments, the halogen-containing gas is supplemented by a separate gas species that is reactive with both the one or more of the metal and a catalyst for deposition of the metal and the halogen-containing gas to form a volatile species to remove the metal. In some embodiments, the modification chemistry can include one or more of a halogen, hydrogen, or halogenated or hydrogenated species, such as $H_2$, HCl, $Cl_2$, HF, HBr, $HBF$, $BF_2$, $BCl_3$, $BBr_3$, $BI_3$, $F_2$, $BF_3$, $Br_2$ and/or $I_2$ as such a separate species.

The modification chemistry may be or include a gas or a plasma or reactive species. The modification operation is conducted so that modification of the surface material to be etched is favored over substantial deposition. The modification operation forms a thin, reactive surface layer with a thickness that is more easily removed than un-modified material. The modification operation may be performed such that spontaneous etching of the substrate is prevented.

In some embodiments, a halogen, e.g., chlorine-based plasma may be generated during this operation. The species generated from a chlorine-based plasma can be generated in situ by forming a plasma in the process chamber housing the substrate or they can be generated remotely in a process chamber that does not house the substrate such as a remote plasma generator, and can be supplied into the process chamber housing the substrate. In various embodiments, the plasma may be an inductively coupled plasma or a capacitively coupled plasma or a microwave plasma. Power for an inductively coupled plasma may be set at between about 50 W and about 2000 W, such as about 900 W. Power may be set at a low enough level so as not to cause direct plasma etching of the substrate.

In some embodiments, a plasma is not used and a halogen, e.g., chlorine, gas may be introduced thermally into the chamber. The energy of dissociation of $Cl_2$ to Cl is 2.51 eV. In some embodiments, this energy may be applied using thermal or other radiative energy sources during this operation. In some embodiments, chlorine may be heated at sufficiently high temperatures to decompose chlorine into chlorine atoms capable of adsorbing onto the surface of a substrate.

In various embodiments, a bias is applied during operation 315. A low bias power may be used to prevent spontaneous etching by the modification chemistry on the surface of the substrate while allowing the modification chemistry adsorb on the surface of the deposited metal and enter a seam that may be formed at or near the opening of a feature. For example, a bias may be applied between about 0V and about 200V. The bias may be used to establish a gradient of modification chemistry throughout the feature depth. By appropriately controlling the bias as well as other parameters such as pressure, the degree of modification (and of ALE) can be controlled throughout the feature depth. In one example, more chlorine may be adsorbed at or near the top of features, or at or near the openings of features, than in the bottom and on the side walls. The bias is applied in such a way so as not to cause physical sputtering of the substrate. In some embodiments, a bias may not be used. In some embodiments, a bias may not be used if the openings of features are large enough. An example pressure range during operation 315 may be between about 30 mTorr and about 80 mTorr.

In some embodiments, a purge may be performed after a modification operation. In a purge operation, non-surface-bound active chlorine species may be removed from the process chamber. This can be done by purging and/or evacuating the process chamber to remove non-adsorbed modification chemistry, without removing the adsorbed layer. The species generated in a chlorine-based plasma can be removed by stopping the plasma and allowing the remaining species to decay, optionally combined with purging and/or evacuation of the chamber. Purging can be done using any inert gas such as $N_2$, Ar, Ne, He, and their combinations.

In operation 335, the modified layer is removed from the substrate by exposure to an activated removal gas, such as a plasma, an activating gas, ion bombardment gas, or chemically reactive gas, to selectively etch the modified deposited material. The activated removal gas may be an inert gas. For example, argon may be used. In some embodiments, neon or krypton may be used. In a removal operation, the substrate may be exposed to an energy source (e.g. activating or ion bombardment gas or chemically reactive species that induces removal), such as argon plasma. In some embodiments, plasma, e.g., argon plasma, may be generated in situ by forming a plasma in the process chamber housing the substrate or can be generated remotely in a process chamber that does not house the substrate such as a remote plasma generator, and can be supplied into the process chamber housing the substrate. In various embodiments, the plasma may be an inductively coupled plasma or a capacitively coupled plasma or a microwave plasma. Power for an inductively coupled plasma may be set at between about 50 W and about 2000 W, such as about 900 W. Power may be set at a low enough level so as not to cause direct plasma etching of the substrate.

The amount of removal gas may be controlled such as to etch only a targeted amount of material. In various embodiments, the pressure of the chamber may vary between the modification and removal operations. The pressure of the removal gas may depend on the size of the chamber, the flow rate of the removal gas, the temperature of the reactor, the type of substrate, the flow rate of any carrier gases, and the amount of deposited material to be etched. An example pressure range during operation 335 may be between about 1 mTorr and about 15 mTorr.

During removal, a bias may be optionally applied to facilitate directional ion bombardment. The bias power is selected to prevent sputtering but allow the removal gas to enter the feature and etch the deposited material at or near the opening of the feature, in the neck or adjacent field, to thereby open it. The bias power may be selected depending on the threshold sputter yield of the activated removal gas with the deposited metal on the substrate.

In some embodiments, the chamber may be purged after a removal operation. Purge processes may be any of those used for a purge after operation 315.

Returning to FIG. 3, operations 303 and 305 may be optionally repeated as necessary to fill the feature. In operation 307, it is determined whether the feature has been sufficiently filled. If not, operations 303 and 305 may be repeated. In some embodiments, operation 303 is repeated and the feature may be sufficiently filled such that operation 305 may not be performed again. In some embodiments, operations 303 and 305 are performed until features are sufficiently filled. In some embodiments, features may be sufficiently filled after performing operation 303 in one of the repeated operations, such that operation 305 is not performed again after features are filled. In some embodiments, operations 303 and 305 are performed in the same chamber. In some embodiments, operations 303 and 305 are performed in the same tool. In some embodiments, operations 303 and 305 are performed without breaking vacuum. In some embodiments, repeated cycles of operation 303 may involve different deposition methods and precursors than in prior cycles of operation 303. For example, in one process, cobalt may be deposited into a feature by ELD, ALE may be performed to etch the deposited tungsten to open the feature, and cobalt deposition may be repeated by this time performing CVD of cobalt using a cobalt-containing precursor and a reducing agent to completely fill the feature.

This Directional ALE can be conducted so that the bottom of the feature to be filled is sub-saturated with the species used to modify the surface, for example, by limiting the time of that process operation. The feature sidewalls, being substantially vertical, are not substantially impacted by energetic ions during the activation operation. In this way, the top/opening of the feature and the field surrounding the feature are selectively/preferentially etched relative to the sidewalls and bottom of the feature so that by alternating the ALE and ELD operations, bottom-up fill is achieved.

Apparatus

Inductively coupled plasma (ICP) reactors which, in certain embodiments, may be suitable for atomic layer etching (ALE) operations are now described. Such ICP reactors have also been described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 4:
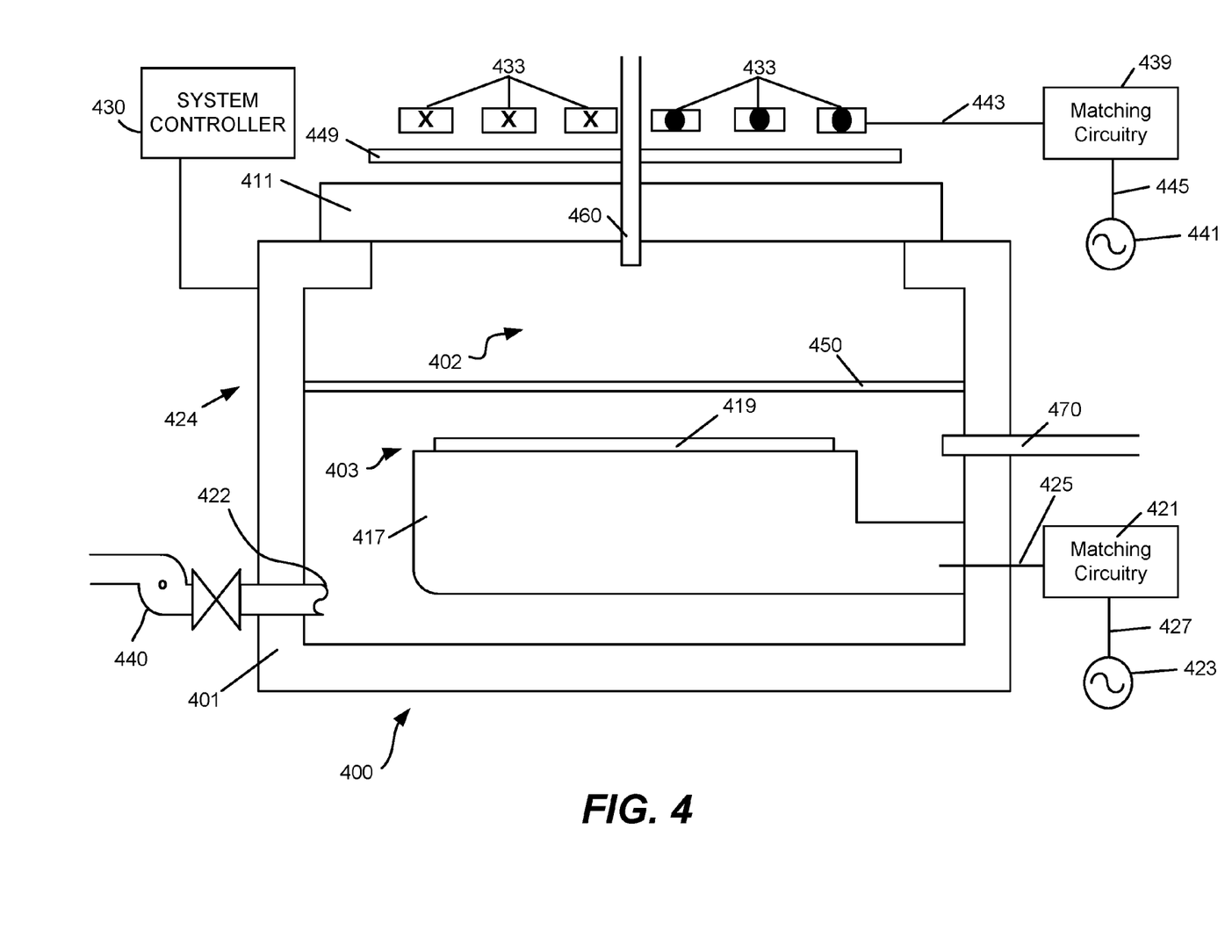
FIG. 4 is a schematic diagram of an example process etch chamber for performing certain disclosed embodiments.

FIG. 4 schematically shows a cross-sectional view of an inductively coupled plasma integrated etching and deposition apparatus 400 appropriate for implementing certain embodiments herein, an example of which is a Kiyo® reactor, produced by Lam Research Corp. of Fremont, Calif. The inductively coupled plasma apparatus 400 includes an overall process chamber 424 structurally defined by chamber walls 401 and a window 411. The chamber walls 401 may be fabricated from stainless steel or aluminum. The window 411 may be fabricated from quartz or other dielectric material. An optional internal plasma grid 450 divides the overall process chamber 424 into an upper sub-chamber 402 and a lower sub-chamber 403. In most embodiments, plasma grid 450 may be removed, thereby utilizing a chamber space made of sub-chambers 402 and 403. A chuck 417 is positioned within the lower sub-chamber 403 near the bottom inner surface. The chuck 417 is configured to receive and hold a semiconductor substrate or wafer 419 upon which the etching and deposition processes are performed. The chuck 417 can be an electrostatic chuck for supporting the wafer 419 when present. In some embodiments, an edge ring (not shown) surrounds chuck 417, and has an upper surface that is approximately planar with a top surface of the wafer 419, when present over chuck 417. The chuck 417 also includes electrostatic electrodes for chucking and dechucking the wafer 419. A filter and DC clamp power supply (not shown) may be provided for this purpose. Other control systems for lifting the wafer 419 off the chuck 417 can also be provided. The chuck 417 can be electrically charged using an RF power supply 423. The RF power supply 423 is connected to matching circuitry 421 through a connection 427. The matching circuitry 421 is connected to the chuck 417 through a connection 425. In this manner, the RF power supply 423 is connected to the chuck 417.

Elements for plasma generation include a coil 433 is positioned above window 411. In some embodiments, a coil is not used in disclosed embodiments. The coil 433 is fabricated from an electrically conductive material and includes at least one complete turn. The example of a coil 433 shown in FIG. 4 includes three turns. The cross-sections of coil 433 are shown with symbols, and coils having an "X" extend rotationally into the page, while coils having a "•" extend rotationally out of the page. Elements for plasma generation also include an RF power supply 441 configured to supply RF power to the coil 433. In general, the RF power supply 441 is connected to matching circuitry 439 through a connection 445. The matching circuitry 439 is connected to the coil 433 through a connection 443. In this manner, the RF power supply 441 is connected to the coil 433. An optional Faraday shield 449 is positioned between the coil 433 and the window 411. The Faraday shield 449 is maintained in a spaced apart relationship relative to the coil 433. The Faraday shield 449 is disposed immediately above the window 411. The coil 433, the Faraday shield 449, and the window 411 are each configured to be substantially parallel to one another. The Faraday shield 449 may prevent metal or other species from depositing on the window 411 of the process chamber 424.

Process gases (e.g. metal precursors such as tungsten-containing precursors, reducing agents, carrier gases, halogen-containing gases, chlorine, argon, etc.) may be flowed into the process chamber through one or more main gas flow inlets 460 positioned in the upper sub-chamber 402 and/or through one or more side gas flow inlets 470. Likewise, though not explicitly shown, similar gas flow inlets may be used to supply process gases to a capacitively coupled plasma processing chamber. A vacuum pump 440, e.g., a one or two stage mechanical dry pump and/or turbomolecular pump, may be used to draw process gases out of the process chamber 424 and to maintain a pressure within the process chamber 424. For example, the vacuum pump 440 may be used to evacuate the lower sub-chamber 403 during a purge operation of ALE. A valve-controlled conduit may be used to fluidically connect the vacuum pump to the process chamber 424 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 400, one or more process gases may be supplied through the gas flow inlets 460 and/or 470. In certain embodiments, process gas may be supplied only through the main gas flow inlet 460, or only through the side gas flow inlet 470. In some cases, the gas flow inlets shown in the figure may be replaced by more complex gas flow inlets, one or more showerheads, for example. The Faraday shield 449 and/or optional grid 450 may include internal channels and holes that allow delivery of process gases to the process chamber 424. Either or both of Faraday shield 449 and optional grid 450 may serve as a showerhead for delivery of process gases. In some embodiments, a liquid vaporization and delivery system may be situated upstream of the process chamber 424, such that once a liquid reactant or precursor is vaporized, the vaporized reactant or precursor is introduced into the process chamber 424 via a gas flow inlet 460 and/or 470.

Radio frequency power is supplied from the RF power supply 441 to the coil 433 to cause an RF current to flow through the coil 433. The RF current flowing through the coil 433 generates an electromagnetic field about the coil 433. The electromagnetic field generates an inductive current within the upper sub-chamber 402. The physical and chemical interactions of various generated ions and radicals with the wafer 419 etch features of and deposit layers on the wafer 419.

Volatile etching and/or deposition byproducts may be removed from the lower sub-chamber 403 through port 422. The chuck 417 disclosed herein may operate at elevated temperatures ranging between about 10° C. and about 250° C. The temperature will depend on the process operation and specific recipe.

Apparatus 400 may be coupled to facilities (not shown) when installed in a clean room or a fabrication facility. Facilities include plumbing that provide processing gases, vacuum, temperature control, and environmental particle control. These facilities are coupled to apparatus 400, when installed in the target fabrication facility. Additionally, apparatus 400 may be coupled to a transfer chamber that allows robotics to transfer semiconductor wafers into and out of apparatus 400 using typical automation.

In some embodiments, a system controller 430 (which may include one or more physical or logical controllers) controls some or all of the operations of a process chamber 424. The system controller 430 may include one or more memory devices and one or more processors. For example, the memory may include instructions to alternate between flows of modification chemistry such as a chlorine-containing modification chemistry and a removal gas such as argon, or instructions to ignite a plasma or apply a bias. For example, the memory may include instructions to set the bias at a power between about 0V and about 200V during some operations. In some embodiments, the apparatus 400 includes a switching system for controlling flow rates and durations when disclosed embodiments are performed. In some embodiments, the apparatus 400 may have a switching time of up to about 500 ms, or up to about 750 ms. Switching time may depend on the flow chemistry, recipe chosen, reactor architecture, and other factors.

In some embodiments, disclosed embodiments can be integrated on a MSSD (Multi-Station-Sequential-Deposition) chamber architecture in which one of deposition stations can be replaced by an ALE station to allow an integrated deposition/etch/deposition process using a similar chemistry for better fill and faster throughput capability.

In some implementations, the system controller 430 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 430, which may control various components or subparts of the system or systems. The system controller 430, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 430 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 430, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 430 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 430 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, etch and deposition apparatus suitable for implementing feature fill methods described herein may be integrated in a cluster architecture system. Example systems may include a plasma etch chamber or module, a deposition chamber or module, a spin-rinse chamber or module, a metal plating chamber or module, an electroless deposition (ELD) module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that manufacturing factory.

Figure 5:
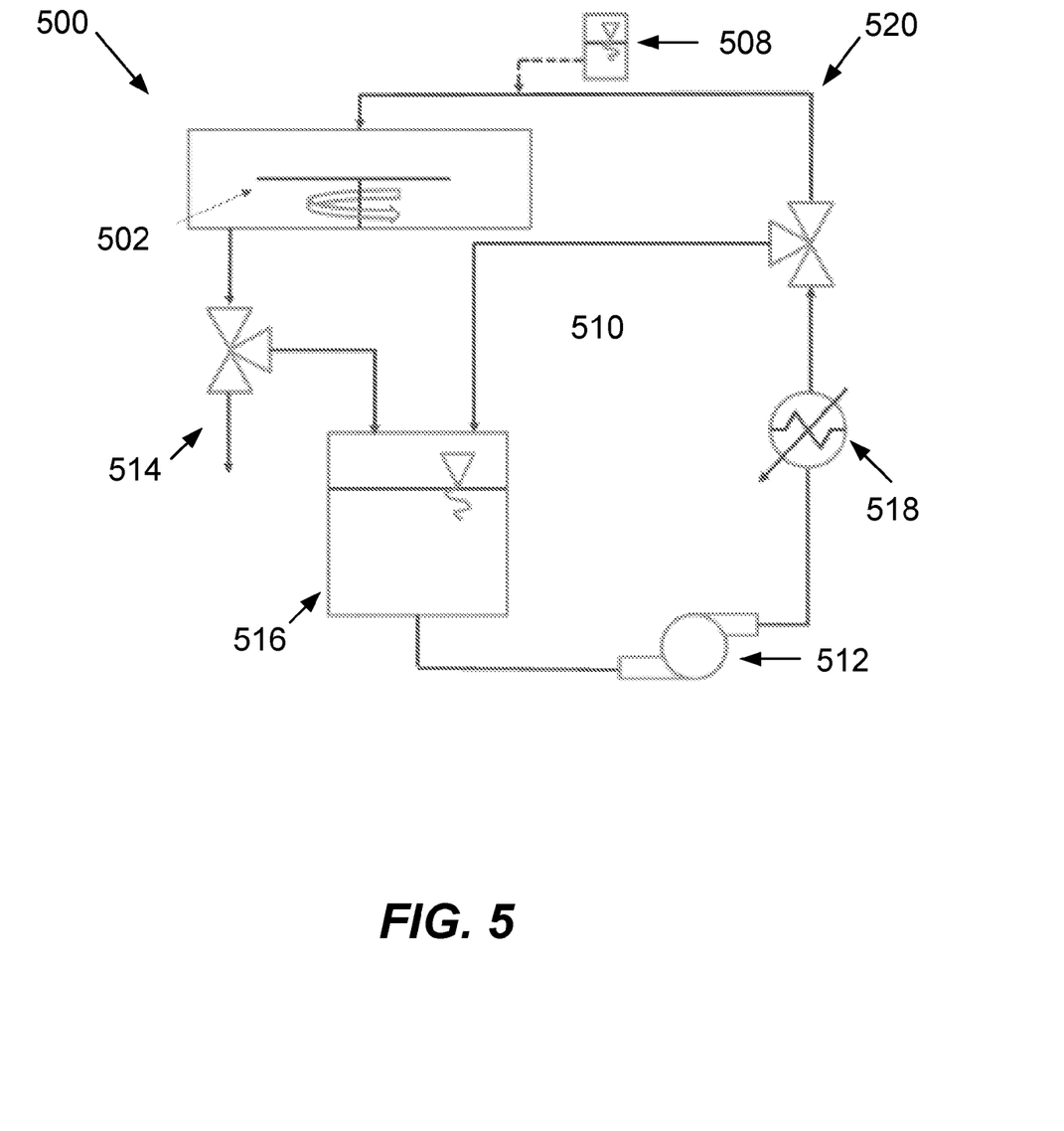
FIG. 5 is a schematic diagram of an example process electroless deposition chamber for performing certain disclosed embodiments.

FIG. 5 schematically shows a simplified cross-sectional view of an electroless plating apparatus suitable for implementation of a bottom-up feature fill, in particular ELD, in accordance with one embodiment, an example of which is a 2300® ELD reactor, produced by Lam Research Corporation of Fremont, Calif. Chamber 500 includes a rotating chuck 502 on top of which a wafer or substrate rests. The wafer is heated by deposition solution that comes into the deposition chamber at elevated temperature. The deposition solution that leaves the wafer's surface is either drained or recovered back into the chemical tank 516 which contains the deposition solution. The electroless deposition system can operate in point-of-use (POU) mode or in recirculation/recovery mode. In one embodiment, the POU involves adding a reducing agent from a reducing agent tank 508 after a three-way valve i.e., it is not mixed into the chemical tank 516. The recirculation loop 510 can be maintained at room temperature or elevated temperature as needed, for example by a heater 518. This elevated temperature may be above about 45° C. in an exemplary embodiment, and between about 50° C. and about 60° C. in another exemplary embodiment. Fluid is moved through recirculation loop 510, for example by pump 512, and feeds into delivery line 520, which ultimately delivers the fluid to a top surface of a wafer on the chuck 502. It should be appreciated that as reducing agent 508 can cause instability in the electrolyte solution, adding the reducing agent at a point of use improves process stability. In addition, as the amount of reducing agent to be added to the electrolyte solution through delivery line 520, is relatively small, the dilution will not substantially affect the temperature of the fluid if the fluid recirculation loop 510 is held at an elevated temperature.

In one embodiment, the film is a cobalt-based film. In this embodiment, the portion of the plating solution recirculated in the recirculation loop may have a composition as cited in the literature referenced above. One skilled in the art should appreciate that many other versions of plating solutions (e.g., with alternative metal ion sources, complexing agents, reducing agents, buffering agents, pH adjustors, stabilizers, surfactants, etc. may be incorporated with the embodiments described herein as the above referenced solution compositions are exemplary and not meant to be limiting.

Figure 6:
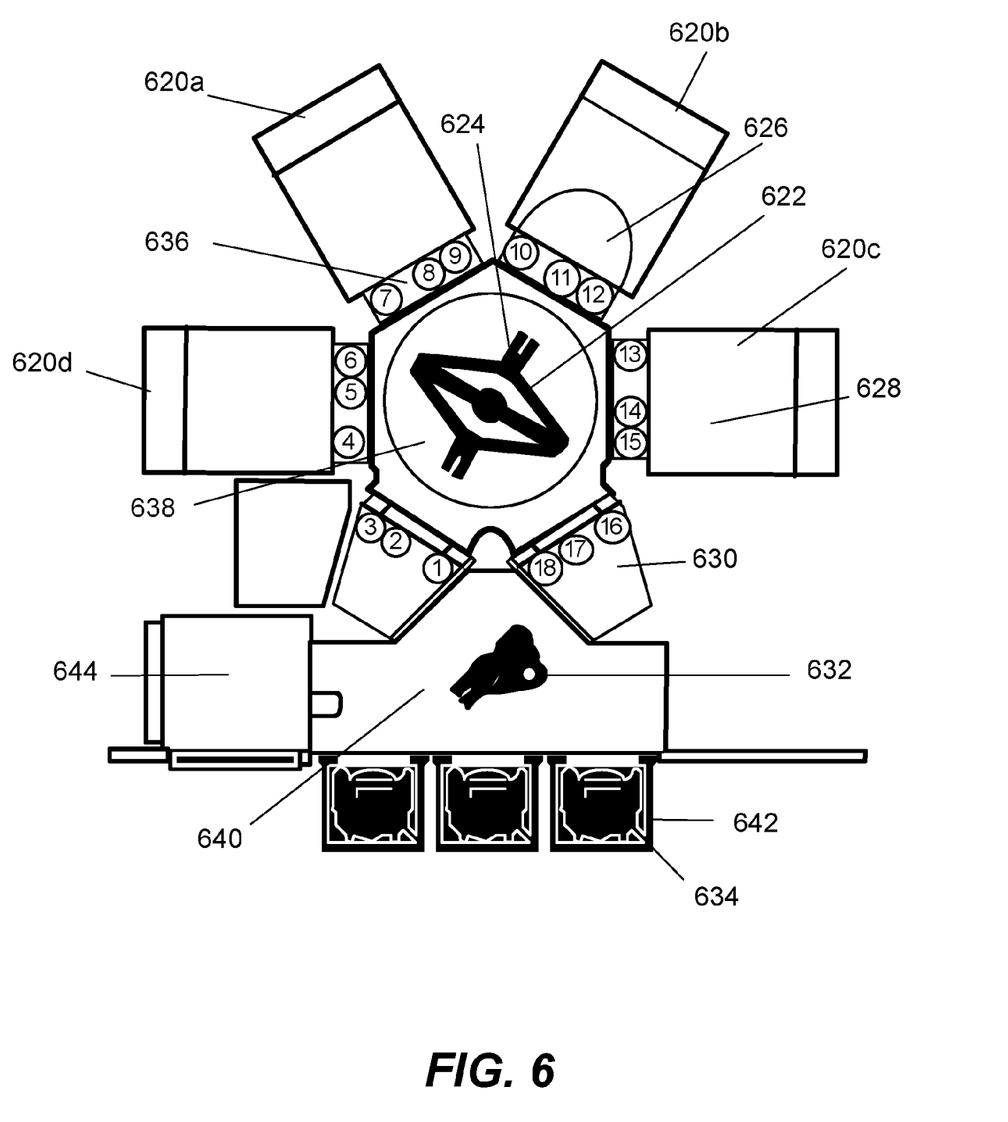
FIG. 6 is a schematic diagram of an example process apparatus for performing certain disclosed embodiments.

FIG. 6 depicts a semiconductor process cluster architecture with various modules that interface with a vacuum transfer module 638 (VTM). The arrangement of various modules to "transfer" wafers among multiple storage facilities and processing modules may be referred to as a "cluster tool architecture" system or platform. Airlock 630, also known as a loadlock or transfer module, interfaces with the VTM 638 which, in turn, interfaces with four processing modules 620a-620d, which may be individual optimized to perform various fabrication processes. By way of example, processing modules 620a-620d may be implemented to perform substrate etching, electroless deposition, ion implantation, wafer cleaning, sputtering, and/or other semiconductor processes. In some embodiments, ALE and bottom-up fill deposition, e.g., ELD, are performed in different modules of the same platform. One or more of the substrate etching processing modules (any of 620a-620d) may be implemented as disclosed herein, i.e., for depositing conformal films, directionally etching films by ALE, etching patterns, and other suitable functions in accordance with the disclosed embodiments. Airlock 630 and processing modules 620a-620d may be referred to as "stations." Each station has a facet 636 that interfaces the station to VTM 638. Inside each facet, sensors 1-18 are used to detect the passing of wafer 626 when moved between respective stations.

Robot 622 transfers wafer 626 between stations. In one embodiment, robot 622 has one arm, and in another embodiment, robot 622 has two arms, where each arm has an end effector 624 to pick wafers such as wafer 626 for transport. Front-end robot 632, in atmospheric transfer module (ATM) 640, is used to transfer wafers 626 from cassette or Front Opening Unified Pod (FOUP) 634 in Load Port Module (LPM) 642 to airlock 630. Module center 628 inside processing module 620a-620d is one location for placing wafer 626. Aligner 644 in ATM 640 is used to align wafers.

In an exemplary processing method, a wafer is placed in one of the FOUPs 634 in the LPM 642. Front-end robot 632 transfers the wafer from the FOUP 634 to an aligner 644, which allows the wafer 626 to be properly centered before it is etched or processed. After being aligned, the wafer 626 is moved by the front-end robot 632 into an airlock 630. Because the airlock 630 has the ability to match the environment between an ATM 640 and a VTM 638, the wafer 626 is able to move between the two pressure environments without being damaged. From the airlock 630, the wafer 626 is moved by robot 622 through VTM 638 and into one of the processing modules 620a-620d. In order to achieve this wafer movement, the robot 622 uses end effectors 624 on each of its arms. Once the wafer 626 has been processed, it is moved by robot 622 from the processing modules 620a-620d to the airlock 630. From here, the wafer 626 may be moved by the front-end robot 632 to one of the FOUPs 634 or to the aligner 644.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 4 may be implemented with the tool in FIG. 6.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of filling features on a semiconductor substrate, the method comprising:
   (a) directionally atomic layer etching a deposited material comprising one or more of a metal and a catalyst for deposition of the metal from at least one of a neck region and an adjacent field region of a feature on a semiconductor substrate by,
      (i) modifying the surface of the deposited material by exposing the material to a halogen-containing gas, and
      (ii) exposing the modified surface to an activation gas to selectively etch the modified deposited material; and
   (b) depositing the metal in the feature by a bottom-up fill deposition technique.

2. The method of claim 1, wherein the modification operation is conducted such that modification of the metal to be etched is favored over substantial deposition.

3. The method of claim 1, wherein the bottom of the feature is sub-saturated with the species used to modify the surface.

4. The method of claim 1, wherein the at least one of the neck region and the adjacent field region of the feature is preferentially etched relative to the feature sidewalls and bottom so that bottom-up fill is achieved.

5. The method of claim 1, wherein prior to operation (b), deposition of the metal in the at least one of the neck region and the adjacent field region of the feature is inhibited by exposure to and adsorption of at least one species selected from the group consisting of nitrogen, phosphorous.

6. The method of claim 1, wherein the activation gas is selected from the group consisting of neon, krypton, and argon.

7. The method of claim 1, wherein the activation gas is Ar.

8. The method of claim 1, wherein a bias is applied at operation (a)(ii).

9. The method of claim 1, wherein the bottom-up fill technique is electroless deposition (ELD).

10. The method of claim 9, wherein the metal comprises one selected from the group consisting of cobalt, a cobalt alloy, copper, a copper alloy, nickel, a nickel alloy and ruthenium.

11. The method of claim 10, wherein the metal is cobalt.

12. The method of claim 11, wherein the halogen-containing gas is of the formula SiHaXb, wherein X is a halogen including Cl, F, Br, and I, and a+b=4.

13. The method of claim 12, wherein the halogen-containing gas is $SiCl_4$.

14. The method of claim 13, wherein the deposited material is one or more of the metal and a catalyst for deposition of the metal.

15. The method of claim 14, wherein the halogen-containing gas is supplemented by a separate gas species that is reactive with both the one or more of the metal and a catalyst for deposition of the metal and the halogen-containing gas to form a volatile species to remove the metal.

16. The method of claim 15, wherein the separate species is one or more of a halogen, hydrogen, or halogenated or hydrogenated species.

17. The method of claim 16, wherein the separate species is selected from the group consisting of $H_2$, HCl, $Cl_2$, HF, HBr, HBF, $BF_2$, $BCl_3$, $BBr_3$, $BI_3$, $F_2$, $BF_3$, $Br_2$ and $I_2$, and combinations thereof.

18. A method comprising:
   (a) directionally atomic layer etching cobalt from a neck region of a feature on a semiconductor by exposing the substrate to alternating pulses of a halogen-containing gas and an activation gas; and
   (b) at least partially filling the feature with cobalt by ELD.

19. An apparatus for processing semiconductor substrates, the apparatus comprising:
   a process etch chamber comprising a showerhead and a substrate support,
   a plasma generator, and
   an electroless plating chamber;
   a controller having at least one processor and a memory,
      wherein the at least one processor and the memory are communicatively connected with one another,
      the at least one processor is at least operatively connected with flow-control hardware, and
      the memory stores machine-readable instructions for:
         (a) in the process etch chamber, directionally atomic layer etching a deposited material comprising one or more of a metal and a catalyst for deposition of the metal from at least one of a neck region and an adjacent field region of a feature on a semiconductor substrate by,
            (i) modifying the surface of the deposited material by exposing the material to a halogen-containing gas, and
            (ii) exposing the modified surface to an activation gas to selectively etch the modified deposited material; and
         (b) in the electroless deposition chamber, depositing the & metal in the feature by a bottom-up fill deposition technique.

20. The apparatus of claim 19, wherein the bottom-up fill technique is electroless deposition (ELD).

* * * * *

UNITED STATES PATENT AND TRADEMARK OFFICE
CERTIFICATE OF CORRECTION

PATENT NO. : 9,837,312 B1
APPLICATION NO. : 15/286421
DATED : December 5, 2017
INVENTOR(S) : Samantha Tan et al.

Page 1 of 1

It is certified that error appears in the above-identified patent and that said Letters Patent is hereby corrected as shown below:

In the Specification

Column 3, Line 38, please add --rate-- after the word "deposition"

Column 11, Line 15, please delete "tungsten" and add the word --cobalt--

In the Claims

In Claim 18, Column 18, Line 17, please add the word --substrate-- after "semiconductor"

In Claim 19, Column 18, Line 26, please, after "electroless", delete the word "plating" and add --deposition--

In Claim 19, Column 18, Line 46, please delete the "&"

Signed and Sealed this
Twenty-fourth Day of April, 2018

Andrei Iancu
*Director of the United States Patent and Trademark Office*